(12) United States Patent
Hase et al.

(10) Patent No.: US 6,365,925 B2
(45) Date of Patent: *Apr. 2, 2002

(54) SEMICONDUCTOR DEVICE

(75) Inventors: Ichiro Hase, Kanagawa; Mitsuhiro Nakamura, Tokyo; Hidetoshi Kawasaki; Shinichi Wada, both of Kanagawa, all of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,584

(22) Filed: Sep. 11, 1998

(30) Foreign Application Priority Data

Sep. 12, 1997 (JP) ................................. 9-249217

(51) Int. Cl.[7] ..................... H01L 31/072; H01L 31/109; H01L 31/0328; H01L 31/0336
(52) U.S. Cl. ................. 257/194; 257/192; 257/200
(58) Field of Search ................. 257/192, 194, 257/24, 200; 438/590, 285

(56) References Cited

U.S. PATENT DOCUMENTS

| | | | | |
|---|---|---|---|---|
| 4,903,091 A | * | 2/1990 | Baba et al. | 257/194 |
| 5,023,674 A | * | 6/1991 | Hikosaka et al. | 257/24 |
| 5,159,414 A | * | 10/1992 | Izumi et al. | 257/192 |
| 5,161,235 A | * | 11/1992 | Shur et al. | 257/24 |
| 5,181,087 A | * | 1/1993 | Uasagawa et al. | 257/194 |
| 5,751,027 A | * | 5/1998 | Sawada et al. | 257/192 |
| 6,028,328 A | * | 2/2000 | Riechert et al. | 257/194 |

* cited by examiner

Primary Examiner—Tom Thomas
Assistant Examiner—Shouxiang Hu
(74) Attorney, Agent, or Firm—Sonnenschein, Nath & Rosenthal

(57) ABSTRACT

A semiconductor device that is easily operated with a single positive voltage supply and exhibits an excellent linearity of mutual conductance and source-gate capacitance with regard to a gate voltage is provided. The semiconductor device comprises a second barrier layer of AlGaAs, a channel layer of InGaAs and a first barrier layer of AlGaAs that are stacked in this order on a substrate of GaAs with a buffer layer of u-GaAs between the substrate and the second barrier layer. Carrier supply regions doped with n-type impurity are formed in part of the first and second barrier layers. A low resistivity region including a high concentration of p-type impurity (Zn) is formed in the first barrier layer. The low resistivity region is buried in a high resistivity region and brought to contact with a gate electrode. Upon an application of positive voltage to the gate electrode, a carrier deficient region disappears in the channel layer and no parasitic resistance component remains.

17 Claims, 15 Drawing Sheets

SEMICONDUCTOR DEVICE

BACKGROUND OF THE INVENTION

1. Field of the Invention

The present invention relates to a semiconductor device comprising a gate electrode between a source electrode and a drain electrode and particularly to a semiconductor device comprising a barrier layer between a gate electrode and a channel layer.

2. Description of the Related Art

Demands for small-size and low-power consumption portable communication terminals have grown in the field of mobile communications systems. In order to implement such terminals, a power amplifier, for example, is required to be operable with a single positive voltage supply, at low voltage and with high power-added efficiency. In addition, low distortion characteristics are required for the power amplifier, especially in the advanced wireless communication system such as CDMA (Code Division Multiple Access).

Devices that have been practically utilized for such power amplifiers include a junction field effect transistor (JFET), a metal-semiconductor field effect transistor (MESFET) and a heterojunction field effect transistor (HFET).

Current modulation takes place through the use of a p-n junction in the JFET. FIG. 1 shows an example of configuration of the JFET. The JFET comprises a channel region 414 made of n-type GaAs on a substrate 11 made of semi-insulating single-crystal GaAs. The channel region 414 may be formed either directly on the substrate 11 or on a p-type layer 441 made of p-type GaAs formed on the substrate 11. A p-type region 442 made of p-type GaAs is formed on the channel region 414. A gate electrode 20 is formed in contact with the p-type region 442. The JFET further includes a depletion layer 443 at the interface between the p-type region 442 and the channel region 414. Upon an application of voltage to the gate electrode 20, the current flowing between a source electrode 18 and a drain electrode 19 (the channel region 414) is modulated.

The MESFET modulates current through the use of a Schottky junction. FIG. 2 shows an example of configuration of the MESFET. The MESFET has a configuration similar to that of the JFET shown in FIG. 1 except that the p-type region 442 is eliminated and the gate electrode 20 is formed on a channel region 514 with a depletion layer 543 in between. Upon an application of voltage to the gate electrode 20, the current flowing between the source electrode 18 and the drain electrode 19 (the channel region 514) is modulated. As shown in FIG. 2, a MESFET generally has a recessed structure wherein the thickness of the channel layer 514 near the gate electrode 20 is thin.

The HFET modulates current through the use of a hetero junction. FIG. 3 shows an example of configuration of the HFET. The HFET comprises a second barrier layer 13 of AlGaAs, the channel layer 14 of InGaAs and a first barrier layer 615 of AlGaAs stacked in this order on the substrate 11 of semi-insulating single-crystal GaAs with a buffer layer 12 of GaAs between the substrate 11 and the second barrier layer 13. The gate electrode 20 is formed on the first barrier layer 615. The barrier layers 13 and 615 each have carrier supply regions 13a and 15a including n-type impurity in high resistivity regions 13b and 15b, respectively. Upon an application of voltage to the gate electrode 20, the current flowing between the source electrode 18 and the drain electrode 19 (the channel region 14) is modulated. As shown in FIG. 3, the HFET generally has a recessed structure wherein the thickness of the barrier layer 615 near the gate electrode 20 is thin. A carrier deficient region 14a (the dotted region in FIG. 3) is formed in the channel layer 14 directly beneath the recessed region, that is, the thin part of the first barrier layer 615. The carrier deficient region 14a is a region that is depleted of carriers or has fewer carriers than the other region in the channel layer.

Although these FETs described so far each have advantages, they have disadvantages, too. For example, the JFET has an advantage in that the built-in voltage is 1.4 V that is high enough to allow an application of positive voltage of 1 V or above since the JFET uses a p-n junction gate. Another advantage is that the JFET is free from a problem of increase in 'parasitic source resistance' (resistance between the source electrode 18 and the gate electrode 20) in contrast to the conventional MESFET and the HFET. Therefore, the JFET is easily operated with a single positive voltage supply that applies positive voltage to both between the source electrode 18 and the drain electrode 19 and between the source electrode 18 and the gate electrode 20.

However the JFET has a disadvantage in that capacitance Cgs between the gate electrode 20 and the source electrode 18 (gate-source capacitance) and mutual conductance Gm significantly vary depending on gate voltage Vg since the depletion layer 443 expands or contracts upon an application of voltage to the gate electrode 20. That is, linearity of gate-source capacitance Cgs and mutual conductance Gm with respect to gate voltage Vg is not satisfactory. Distortion characteristic of the power amplifier is thereby restricted.

As in the JFET, the depletion layer 543 of the MESFET expands or contracts upon an application of positive or negative voltage to the gate electrode 20. Consequently, linearity of gate-source capacitance Cgs and mutual conductance Gm with respect to gate voltage Vg is not satisfactory. In contrast to the JFET, the built-in voltage of the MESFET is about 0.7 V, that is too low to allow an application of positive voltage of 1 V or above to the gate electrode 20. Furthermore, in the MESFET whose threshold voltage Vth is near 0 volt or positive, a part of the recessed region, that is, the thin part of the channel layer 514, over which the gate electrode 20 is not placed (the dotted region in FIG. 2) is likely to remain as a high resistivity region upon an application of positive voltage to the gate electrode 20. Source resistance is thereby raised. Consequently, on-resistance Ron is raised and it is difficult to increase maximum drain current Idmax. Power-added efficiency is thus restricted, and, it is difficult to operate the MESFET with a single positive voltage supply.

In contrast to the JFET and the MESFET, linearity of gate-source capacitance Cgs and mutual conductance Gm of HFET with respect to gate voltage Vg is excellent, because carriers are accumulated in the channel layer 14 of the HFET upon an application of positive voltage to the gate electrode 20.

However, as in the MESFET, upon an application of positive voltage of the order of 1.0 V to the gate electrode 20, carriers remain scarce in the carrier deficient region directly beneath the recessed region over which the gate electrode 20 is not placed (the dotted region in FIG. 4). Resistance Rrec in this region remains as a parasitic resistance component. As in the MESFET, power-added efficiency is thereby restricted and it is difficult to operate the HFET with a single positive voltage supply.

As thus described, no FET of related art has both characteristics. That is, no FET is easily operable with a single positive voltage supply while exhibiting excellent linearity of gate-source capacitance Cgs and mutual conductance Gm with respect to gate voltage Vg.

SUMMARY OF THE INVENTION

It is an object of the invention to provide a semiconductor device easily operable with a single positive voltage supply while exhibiting excellent linearity of gate-source capacitance Cgs and mutual conductance Gm with respect to gate voltage Vg.

A semiconductor device of the invention includes a source electrode and a drain electrode between which a gate electrode is provided. The semiconductor device comprises: a channel layer made of a semiconductor as a current path between the source electrode and the drain electrode; and a first barrier layer formed between the channel layer and the gate electrode and made of a semiconductor whose electron affinity is smaller than that of the semiconductor forming the channel layer. The first barrier layer includes a p-type low resistivity region with a high concentration of p-type impurity provided in correspondence with the gate electrode and a high resistivity region with a low concentration of impurity.

According to the semiconductor device, upon an application of voltage to the gate electrode, a carrier deficient region formed in the channel layer in correspondence with the p-type low resistivity region in the barrier layer is expanded or reduced. Since the p-type low resistivity region is provided in the barrier layer, no parasitic resistance component remains in the channel layer when a positive voltage is applied to the gate electrode. In addition, a high built-in voltage is obtained and an application of high positive voltage to the gate electrode is achieved.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

(First Embodiment)

Figure 1:
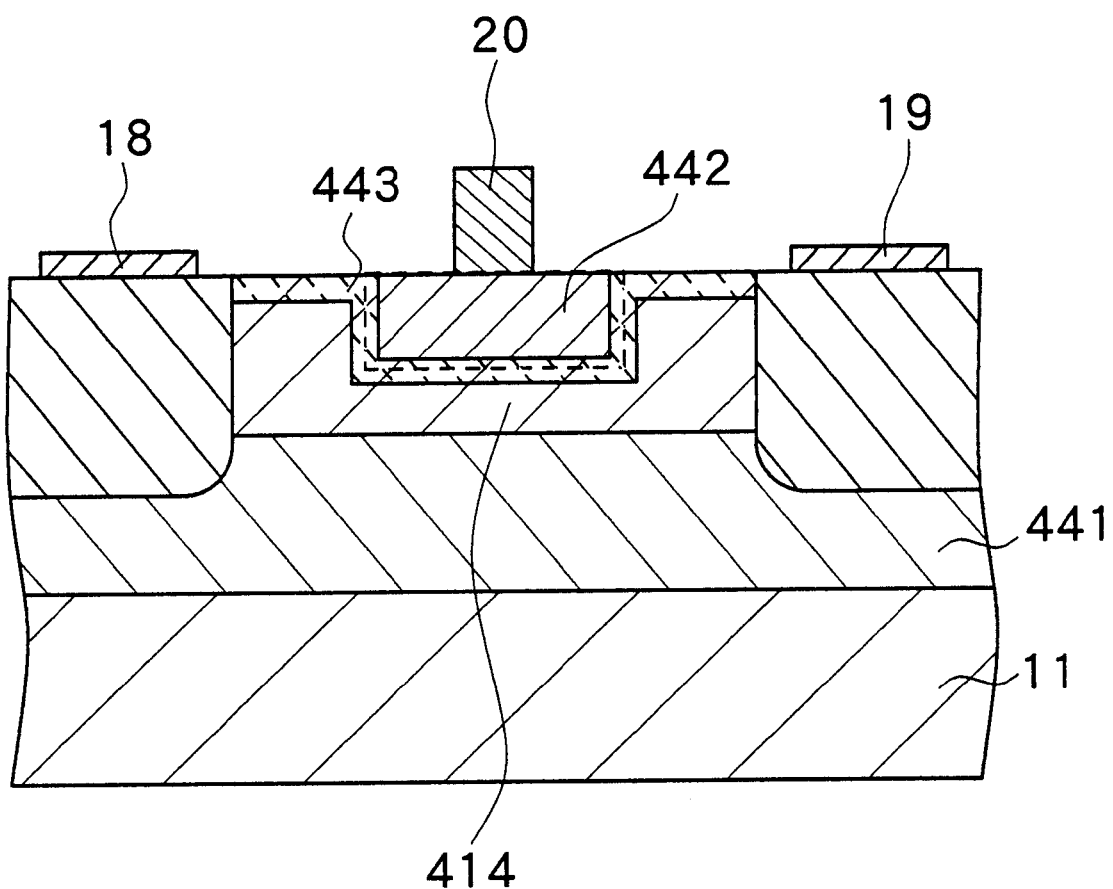
FIG. 1 is a cross section of a related-art JFET.
Figure 2:
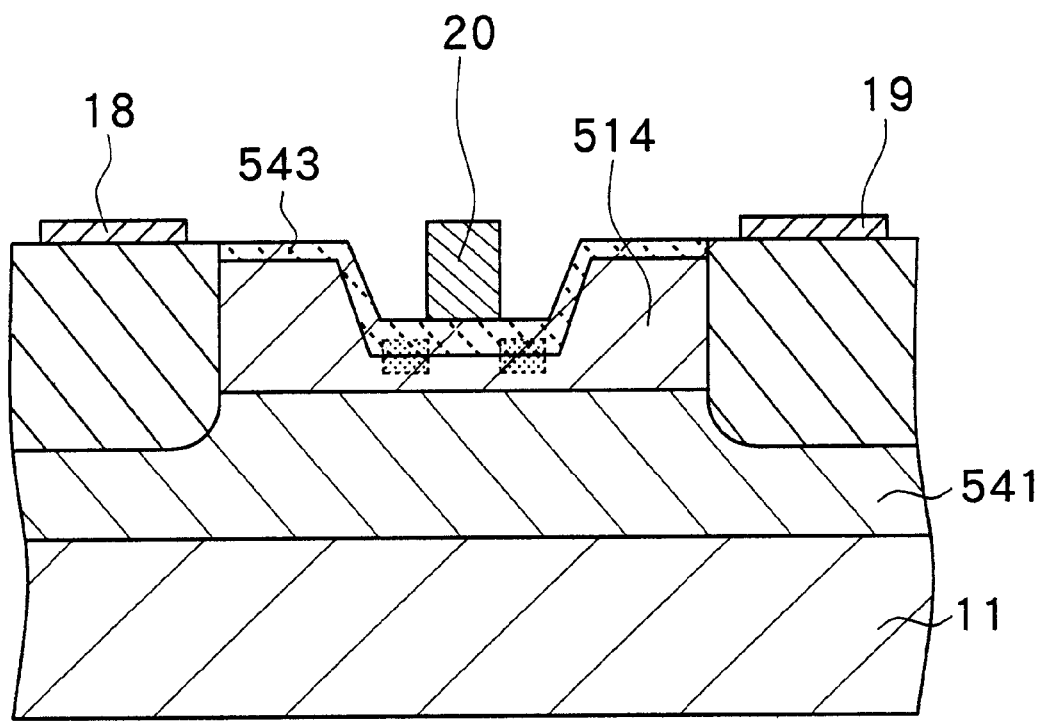
FIG. 2 is a cross section of a related-art MESFET.
Figure 3:
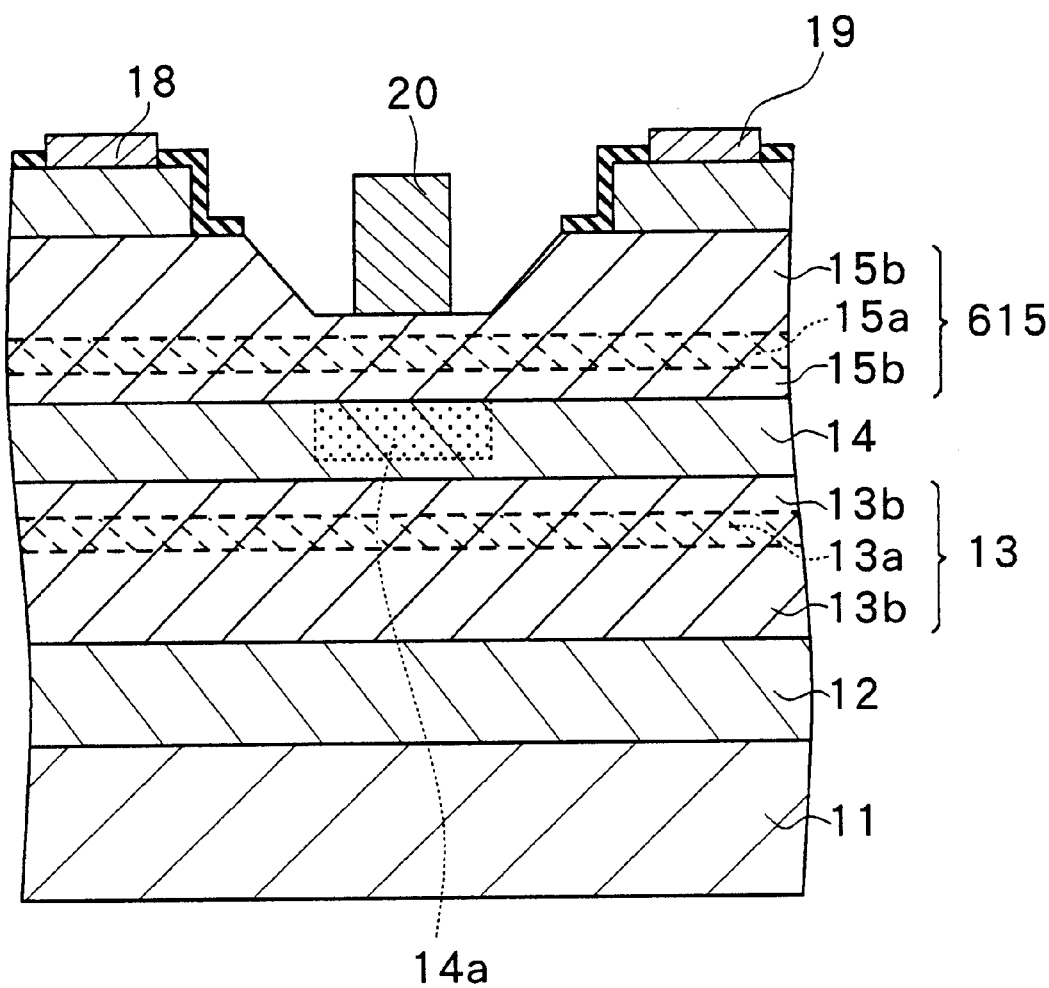
FIG. 3 is a cross section of a related-art HFET.
Figure 4:
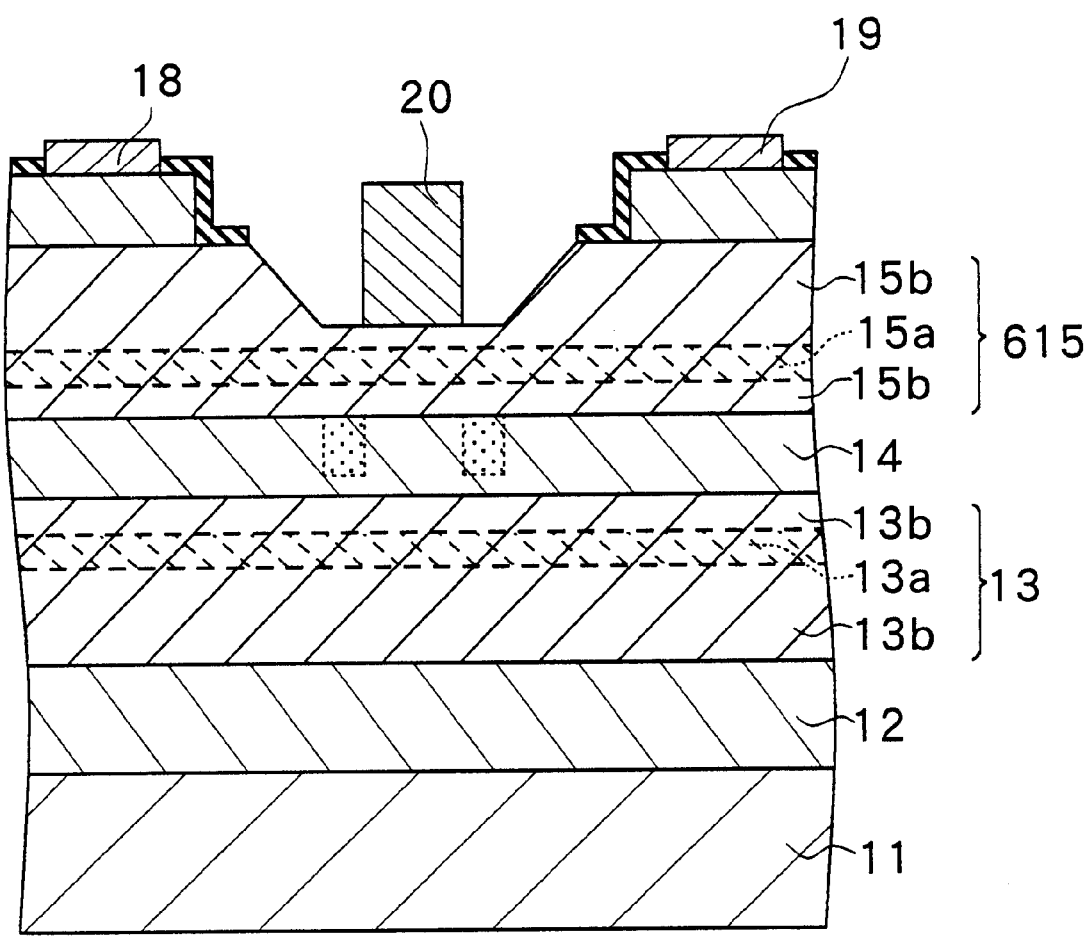
FIG. 4 is a cross section for describing the operation of the HFET shown in FIG. 3.
Figure 5:
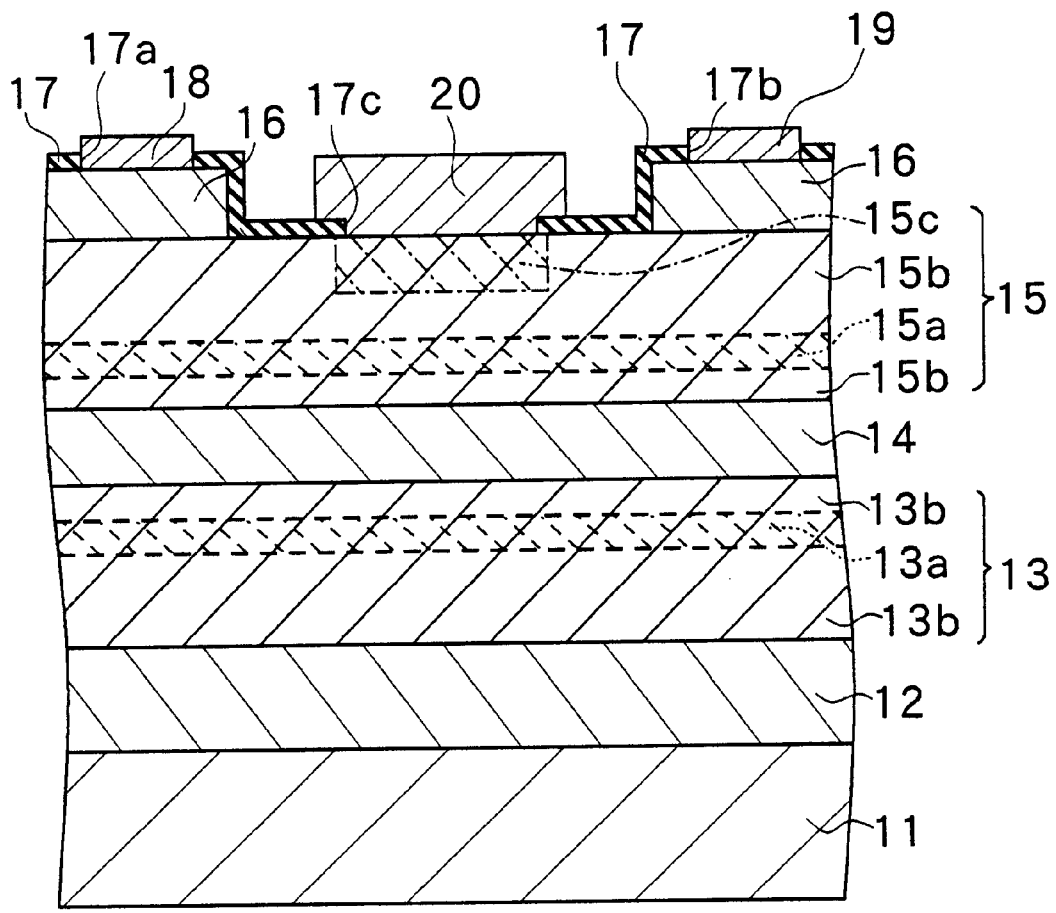
FIG. 5 is a cross section of a semiconductor device of a first embodiment of the invention.

FIG. 5 shows a configuration of a semiconductor device of the first embodiment of the invention. The semiconductor device comprises the second barrier layer 13, the channel layer 14 and the first barrier layer 15, each made of group III–V compound semiconductor and stacked in this order on the substrate 11 of semi-insulating single-crystal GaAs with the buffer layer 12 of u-GaAs ('u-' indicates undoped with impurity in this description) between the substrate 11 and the second barrier layer 13. Cap layers 16 are formed on the first barrier layer 15 with an appropriate space in between. An insulator 17 is formed over the cap layers 16 and the first barrier layer 15. The insulator 17 has holes 17a and 17b each corresponding to the spaced cap layers 16. The source electrode 18 and the drain electrode 19 are each formed on the respective cap layers 16 though the holes 17a and 17b, respectively. The insulator 17 further has a hole 17c through which the gate electrode 20 is formed on the first barrier layer 15.

The second barrier layer 13 is made of a semiconductor whose electron affinity is smaller than that of a semiconductor forming the channel layer 14. For example, AlGaAs is preferable as a semiconductor whose electron affinity is smaller. In the embodiment, the second barrier layer 13 is made of $Al_{0.2}Ga_{0.8}As$ wherein aluminum (Al) mole fraction is 0.2. The second barrier layer 13 includes the carrier supply region 13a containing a high concentration of n-type impurity and the high resistivity region 13b containing a low concentration of impurity. In the embodiment, the configuration of the second barrier layer 13 is such that the high resistivity region 13b having a thickness of 200 nm and undoped with impurity, the carrier supply region 13a having a thickness of 4 nm and doped with silicon as n-type impurity of the order of $1.6 \times 10^{12} cm^{-2}$, and the high resistivity region 13b having a thickness of 2 nm and undoped with impurity, each stacked on the substrate 11 in this order. The second barrier layer 13 may not include the high resistivity region 13b but includes the carrier supply region 13a only.

The channel layer 14 is a current path between the source electrode 18 and the drain electrode 19. The channel layer 14 is made of a semiconductor whose electron affinity is larger than those of semiconductors forming the second barrier layer 13 and the first barrier layer 15. For example, InGaAs is preferable as a semiconductor whose electron affinity is lager. In the embodiment, the channel layer 14 is made of $u-In_{0.2}Ga_{0.8}As$ wherein the indium (In) mole fraction is 0.2.

Carriers supplied from the carrier supply region 13a of the second barrier layer 13 and a carrier supply region 15a of the first barrier layer 15 described below are thereby accumulated in the channel region 14. To form the channel layer 14 with InGaAs, the indium mole fraction is preferably 0.1 or above. This is because the electron affinity is made large with an increase in proportion of indium. If the mole fraction of indium is 0.1 or above, the difference in the electron affinity is large enough between the InGaAs channel and the barrier layers.

The first barrier layer 15 is made of a semiconductor whose electron affinity is smaller than that of the semiconductor forming the channel layer 14. For example, AlGaAs is preferable as the small electron-affinity semiconductor. In the embodiment, the first barrier layer 13 is made of $Al_{0.2}Ga_{0.8}As$ with aluminum mole fraction of 0.2. To form the first barrier layer 15 with AlGaAs, the aluminum mole fraction is preferably 0.25 or below. This is because the source resistance increases with an increase in the aluminum mole fraction.

Although the second barrier layer 13 and the first barrier layer 15 are each made of $Al_{0.2}Ga_{0.8}As$ with the same Al composition in the embodiment, the layers 13 and 15 may be made of AlGaAs with different Al composition from each other. Although the aluminum mole fraction is preferably 0.25 or below in the first barrier layer 15, it is preferable in some cases that the aluminum mole fraction in the second barrier layer 13 is slightly higher than that in the first barrier layer 15 since high aluminum mole fraction in the second barrier layer 13 dose not increase the source resistance.

The first barrier layer 15 includes the carrier supply region 15a containing a high concentration of n-type impurity, the high resistivity region 15b containing a low concentration of impurity, and the p-type low resistivity region 15c containing a high concentration of p-type impurity and provided in correspondence with the gate electrode 20. The configuration of the first barrier layer 15 may be such that the high resistivity region 15b having a thickness of 2 nm and undoped with impurity, the carrier supply region 15a having a thickness of 6 nm and doped with silicon as n-type impurity of the order of $2.4 \times 10^{12} cm^{-2}$, and the high resistivity region 15b having a thickness of 75 nm except the gate region and undoped with impurity, each stacked on the channel layer 14 in this order. The low resistivity region 15c whose p-type impurity concentration is of the order of $1 \times 10^{19} cm^{-3}$ is buried in the high resistivity region 15b in contact with the gate electrode 20. The low resistivity region 15c may be formed through diffusion of zinc (Zn) as p-type impurity into part of the high resistivity region 15b.

In the high resistivity region 15b, the low concentration of $2 \times 10^{17} cm^{-3}$ or below. The low concentration of $1 \times 10^{17} cm^{-3}$ or below is preferable. The high resistivity of $1 \times 10^{-2}$ ohm-cm or above is preferable. In the p-type low resistivity region 15c, the high concentration of $1 \times 10^{18} cm^{-3}$ or above is preferable.

The cap layers 16 may be each made of GaAs having a thickness of 50 nm and doped with silicon as n-type impurity of the order of $4 \times 10^{18} cm^{-3}$. The insulator 17 may be made of silicon nitride ($Si_3N_4$) whose thickness is 200 nm. The source electrode 18 and the drain electrode 19 are each made of AuGe, nickel (Ni) and gold (Au). Ohmic contact is made between each of the cap layers 16 and each of the source electrode 18 and the drain electrode 19, respectively. The gate electrode 20 includes titanium (Ti), platinum (Pt) and gold.

Figure 6:
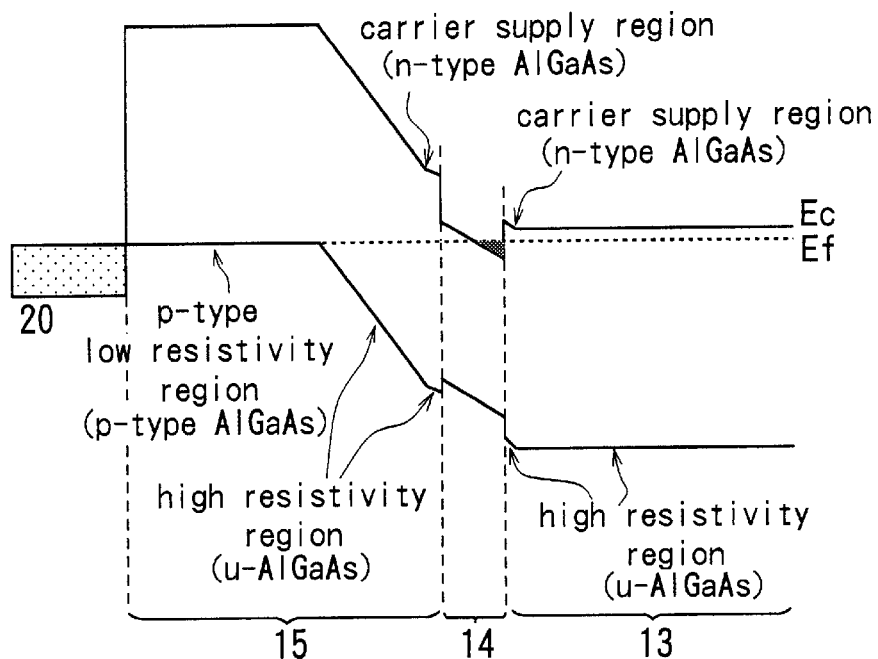
FIG. 6 illustrates an energy band structure of the semiconductor device shown in FIG. 5 wherein no voltage is applied to the gate electrode.
Figure 7:
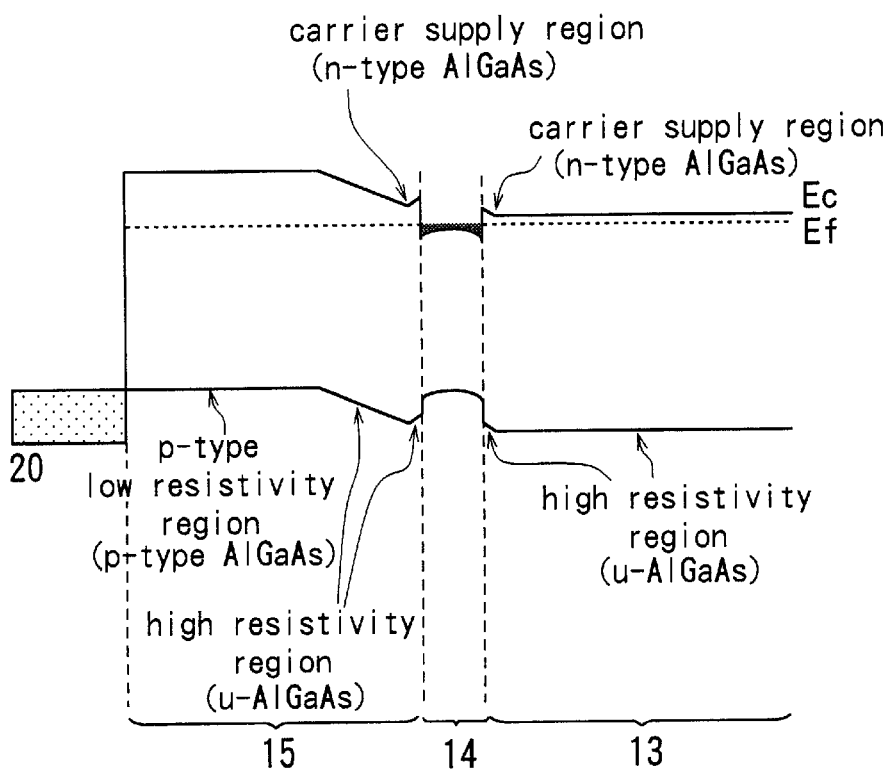
FIG. 7 illustrates an energy band structure of the semiconductor device shown in FIG. 5 wherein a positive voltage is applied to the gate electrode.

FIG. 6 and FIG. 7 illustrate energy band structures of the semiconductor device under the gate electrode 20. FIG. 6 shows the state in which gate voltage Vg is not applied. FIG. 7 shows the state in which gate voltage Vg of 1.2 V or above is applied. FIG. 6 and FIG. 7 show the embodiment wherein the second barrier layer 13 and the first barrier layer 15 are each made of $Al_{0.2}Ga_{0.8}As$ and the channel layer 14 is made of $In_{0.2}Ga_{0.8}As$.

The semiconductor device includes the p-type low resistivity region 15c in the first barrier layer 15. As a result, a higher built-in voltage is obtained compared to a device with a Schottky gate. An application of higher positive voltage to the gate electrode 20 is thereby allowed. In addition, the first barrier layer 15 is made of a semiconductor whose band gap is wide ($Al_{0.2}Ga_{0.8}As$ with a band gap of about 1.67 eV in the embodiment). With an application of gate voltage Vg of 1.2 V or above, for example, the barrier height seen by channel electrons toward the gate is high enough to suppress gate leakage current, as shown in FIG. 7.

Furthermore, conduction-band discontinuity Δ Ec is large enough (0.31 eV in the embodiment) between the channel layer 14 and the first barrier layer 15. The energy difference between the potential minimum of the first barrier layer 15 and the electron quasi-Fermi level in the channel layer 14 is large enough as well (0.20 eV or above in the embodiment). The number of electrons in the first barrier layer 15 is therefore negligible compared to the number of electrons in the channel layer 14. Consequently, the amount of current flowing through the first barrier layer 15 during device operation is negligible, too, compared to the amount of current flowing through the channel layer 14. Such a configuration prevents degradation of mutual conductance Gm due to electrons transfer to the first barrier layer 15 whose mobility is lower than that of the channel layer 14. This condition is maintained until gate voltage Vg reaches around 1.5 V.

Figure 8:
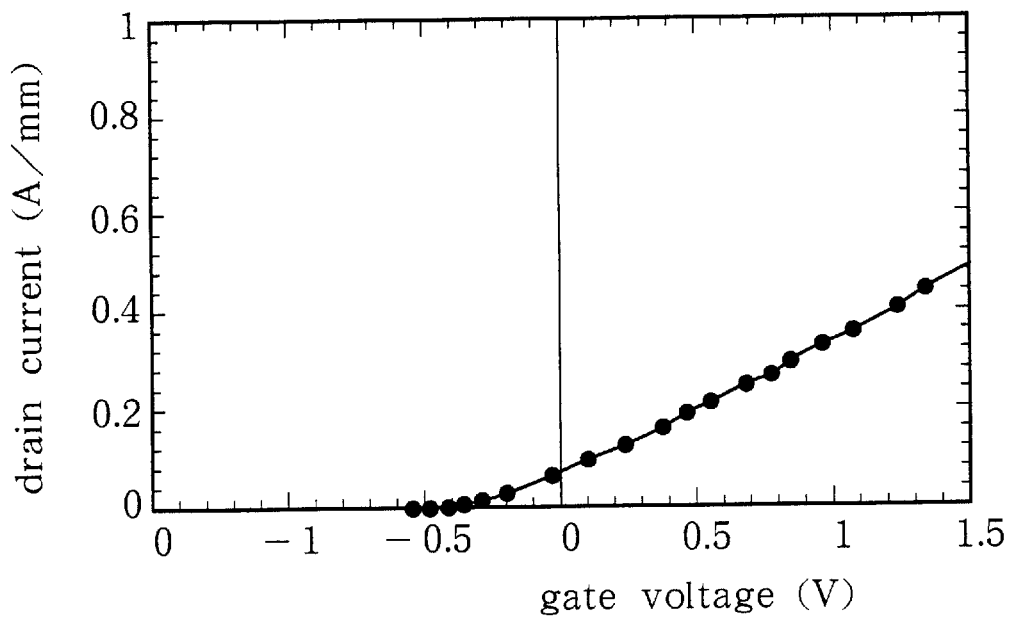
FIG. 8 is a plot for illustrating the relationship between gate voltage Vg and drain current Id of the semiconductor device shown in FIG. 5.
Figure 9:
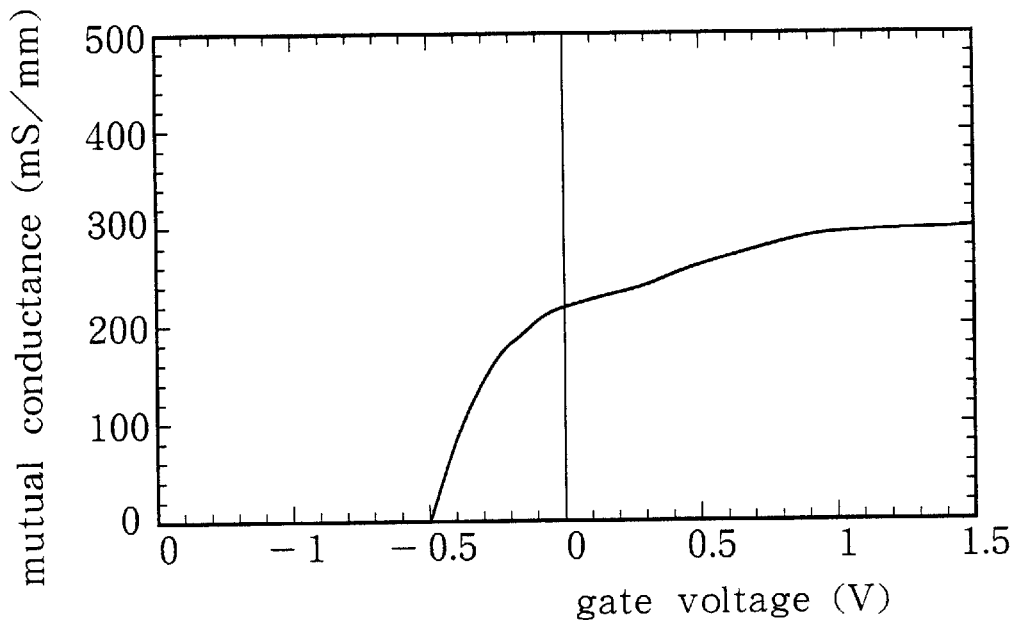
FIG. 9 is a plot for illustrating the relationship between gate voltage Vg and mutual conductance Gm of the semiconductor device shown in FIG. 5.

FIG. 8 shows the relationship between drain current Id and gate voltage Vg of the semiconductor device. FIG. 9 shows the relationship between mutual conductance Gm and gate voltage Vg. FIG. 8 and FIG. 9 show the embodiment wherein the second barrier layer 13 and the first barrier layer 15 are each made of $Al_{0.2}Ga_{0.8}As$ and the channel layer 14 is made of $In_{0.2}Ga_{0.8}As$.

As shown, threshold voltage Vth of the semiconductor device is as low as −0.5 V. An application of gate voltage Vg up to 1.5 V is thus allowed. The variation of mutual conductance Gm with gate voltage Vg is relatively small over a wide Vg range between 0 and 1.5 volt. The relationship between mutual conductance Gm and gate-source capacitance Cgs is represented approximately by Gm=Ve×Cgs, where Ve is electron average velocity. The variation of gate-source capacitance Cgs with gate voltage Vg is thus small as well. That is, operation of the semiconductor device of the embodiment with a single positive voltage supply is performed as easily as or more easily than operation of the related-art JFET. Power-added efficiency η is increased as well.

The semiconductor device of the embodiment operates as follows.

Figure 10:
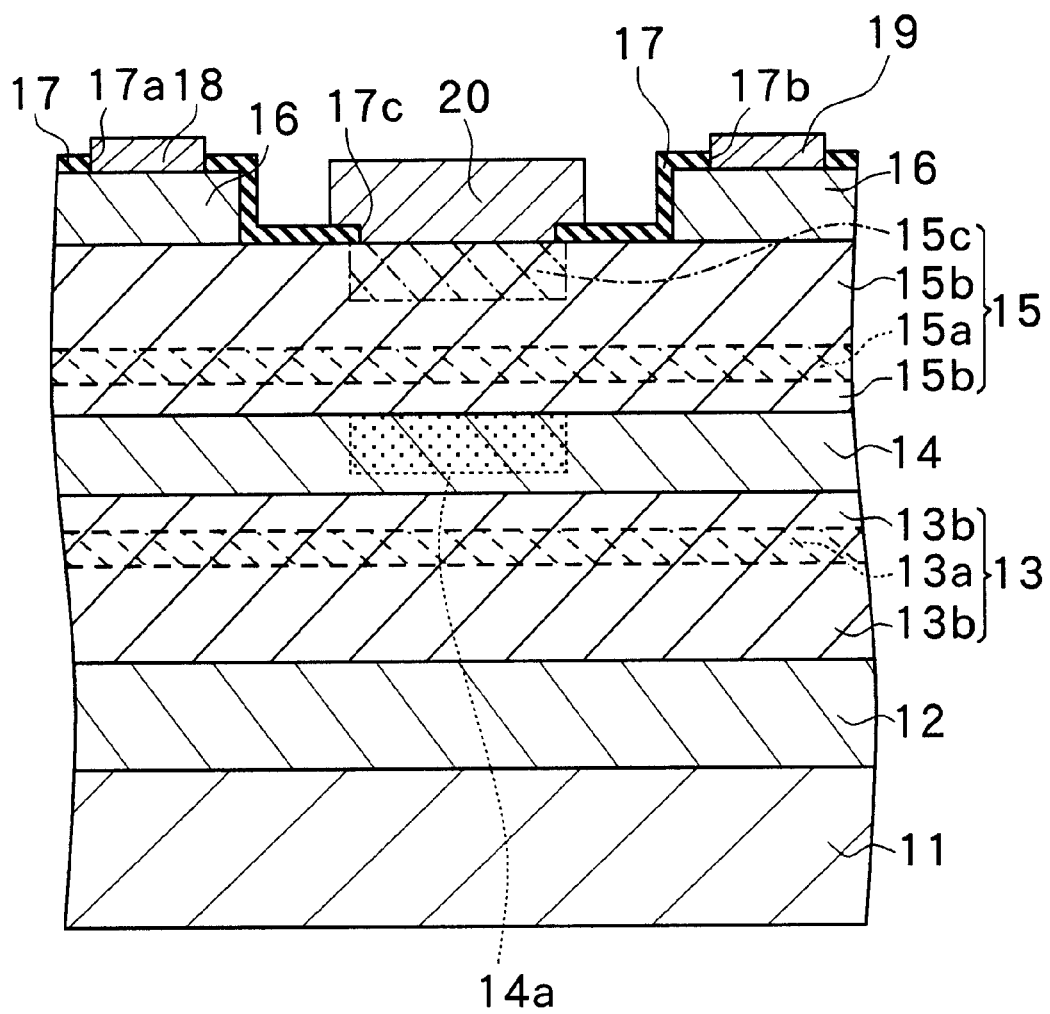
FIG. 10 is a cross section for describing the operation of the semiconductor device shown in FIG. 5.

The semiconductor device of the embodiment is of a depletion type. Therefore, without application of voltage to the gate electrode 20 (Vg=0), as shown in FIG. 10, the carrier deficient region 14a is formed in the region of the channel layer 14 directly beneath the low resistivity region 15c of the first barrier layer 15. The carrier deficient region 14a is a region that is depleted of carriers or has fewer carriers than the other region in the channel layer 14. (See FIG. 6 for the energy band structure thereof.) That is, the channel layer 14 is in the state of high resistivity.

If positive gate voltage Vg of the order of 1.0 V is applied to the gate electrode 20, the carrier deficient region 14a shown in FIG. 10 disappears and the number of carriers in the channel layer 14 increases. Drain current Id is thereby modulated (See FIG. 7 for the energy band structure thereof. That is, the semiconductor device of the embodiment of the invention is free from an increase in parasitic resistance as found in the recessed HFET of related art. Therefore, upon an application of positive voltage to the gate electrode 20, on-resistance Ron of the channel layer 14 decreases and maximum drain current Idmax increases, compared to the recessed HFET. High power-added efficiency η is thus obtained.

An enhancement-type FET to which the present invention is applied operates in a similar manner. The foregoing description is better applicable to the enhancement-type FET.

The semiconductor device of the embodiment may be manufactured as follows.

Figure 11A:
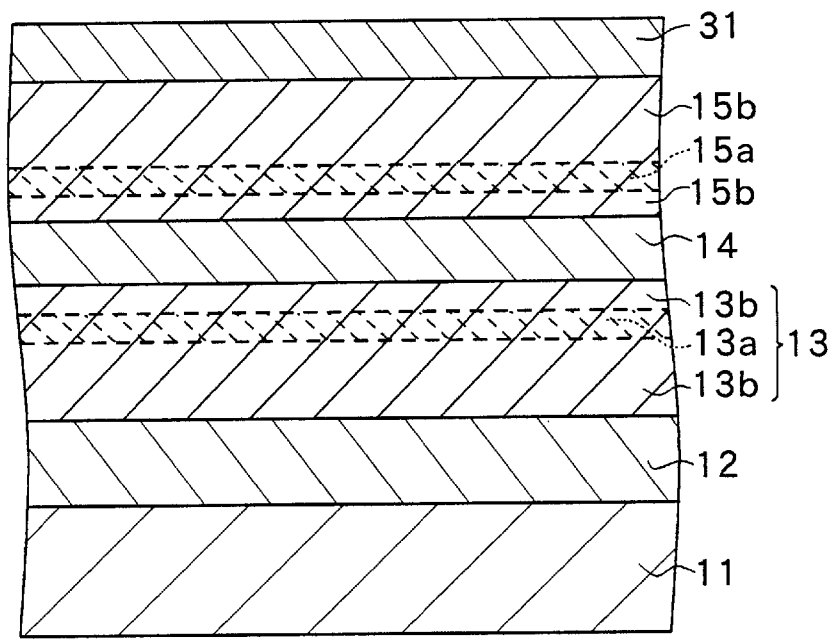
FIG. 11A and FIG. 11B are cross sections for illustrating manufacturing steps of the semiconductor device shown in FIG. 5.

As shown in FIG. 11A, the substrate 11 made of GaAs is utilized, for example, on which a u-GaAs layer undoped with impurity, for example, is epitaxially grown to form the buffer layer 12. On the buffer layer 12, a u-AlGaAs layer undoped with impurity, an n-type AlGaAs layer doped with silicon as n-type impurity, and a u-AlGaAs layer undoped with impurity, for example, are epitaxially grown in this order so as to form the second barrier layer 13 including stacked layers of the high resistivity region 13b, the carrier supply region 13a and the high resistivity region 13b. Next, on the second barrier layer 13, a u-InGaAs layer undoped with impurity, for example, is epitaxially grown to form the channel layer 14. On the channel layer 14, a u-AlGaAs layer undoped with impurity, an n-type AlGaAs layer doped with silicon as n-type impurity, and a u-AlGaAs layer undoped with impurity, for example, are epitaxially grown in this order so as to form the high resistivity region 15b, the carrier supply region 15a and the high resistivity region 15b of the first barrier layer 15. Next, on the first barrier layer 15, the n-type GaAs layer 31 doped with silicon as n-type impurity is epitaxially grown to be the cap layers 16.

Figure 11B:
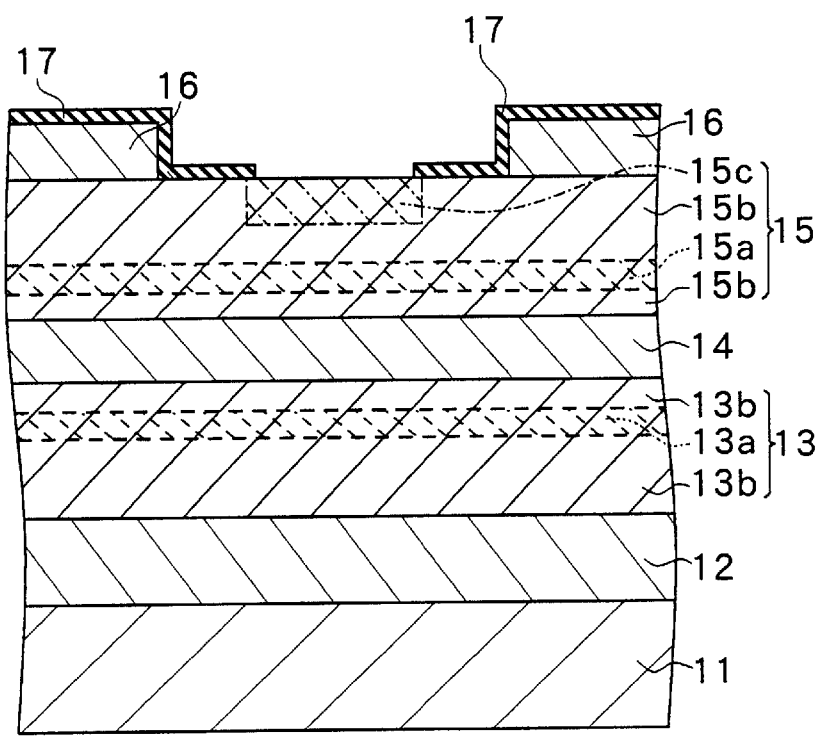

Next, mesa-etching is performed for device isolation (not shown). Ion implantation may be used for the device isolation. As shown in FIG. 11B, the GaAs layer 31 is then partly removed through selective etching to form the cap layers 16. The high resistivity region 15b of the first barrier layer 15 is exposed in the region where the gate electrode is to be formed. Next, a silicon nitride layer is deposited through chemical vapor deposition (CVD), for example, on the cap layers 16 and the high resistivity region 15b so as to form the insulator 17. The insulator 17 is then selectively etched to form the hole 17c in the region where the gate electrode is to be formed. Zinc as p-type impurity is diffused into the high resistivity region 15b at a temperature of the order of 600° C. so as to form the p-type low resistivity region 15c.

On the low resistivity region 15c, titanium, platinum and gold, for example, are deposited in this order and patterned to form the gate electrode 20. Next, the insulator 17 is selectively etched to form the holes 17a and 17b in the regions where the source electrode and the drain electrode are to be formed, respectively. In the holes 17a and 17b, AuGe, nickel and gold, for example, are deposited in this order and patterned. Through heat treatment at a temperature of the order of 400° C., gold-base alloys are produced so as to form the source electrode 18 and the drain electrode 19. The semiconductor device shown in FIG. 5 is thus completed.

The semiconductor device of the embodiment described so far comprises the first barrier layer 15 placed between the channel layer 14 and gate electrode 20. The first barrier layer 15 is made of a semiconductor whose electron affinity is smaller than that of a semiconductor making up the channel layer 14. As a result, the variation of mutual conductance Gm and gate-source capacitance Cgs with gate voltage Vg is reduced and low distortion characteristics are improved.

In addition, the p-type low resistivity region 15c is formed in the first barrier layer 15 in correspondence with the gate electrode 20. As a result, a high built-in voltage is obtained and a high positive voltage is applicable to the gate electrode 20. Furthermore, upon an application of positive voltage to the gate electrode 20, parasitic resistance component Rrec in the channel layer 14 is reduced. On-resistance Ron of the channel layer 14 decreases and maximum drain current Idmax increases. High power-added efficiency is thus obtained. The operation of the device with a single positive voltage supply is thus easily achieved.

Since the built-in voltage is high, the impurity concentration of the carrier supply regions 13a and 15a is required to be raised so as to obtain a threshold voltage similar to that obtained in a related-art device. As a result, the source resistance is reduced and on-resistance Ron of the channel layer 14 is thereby reduced. Threshold voltage Vth being equal, the impurity concentration of the carrier supply regions 13a and 15a of the semiconductor device of the embodiment is about twice as high as that of a related-art HFET.

The first barrier layer 15 being made of AlGaAs, a builtin voltage higher than that of a related art JFET using GaAs is obtained. As a result, better effects are obtained.

Since the p-type low resistivity region 15c is buried in the high resistivity region 15b, break-down voltage between the gate electrode 20 and the drain electrode 19 increases.

(Second Embodiment)

Figure 12:
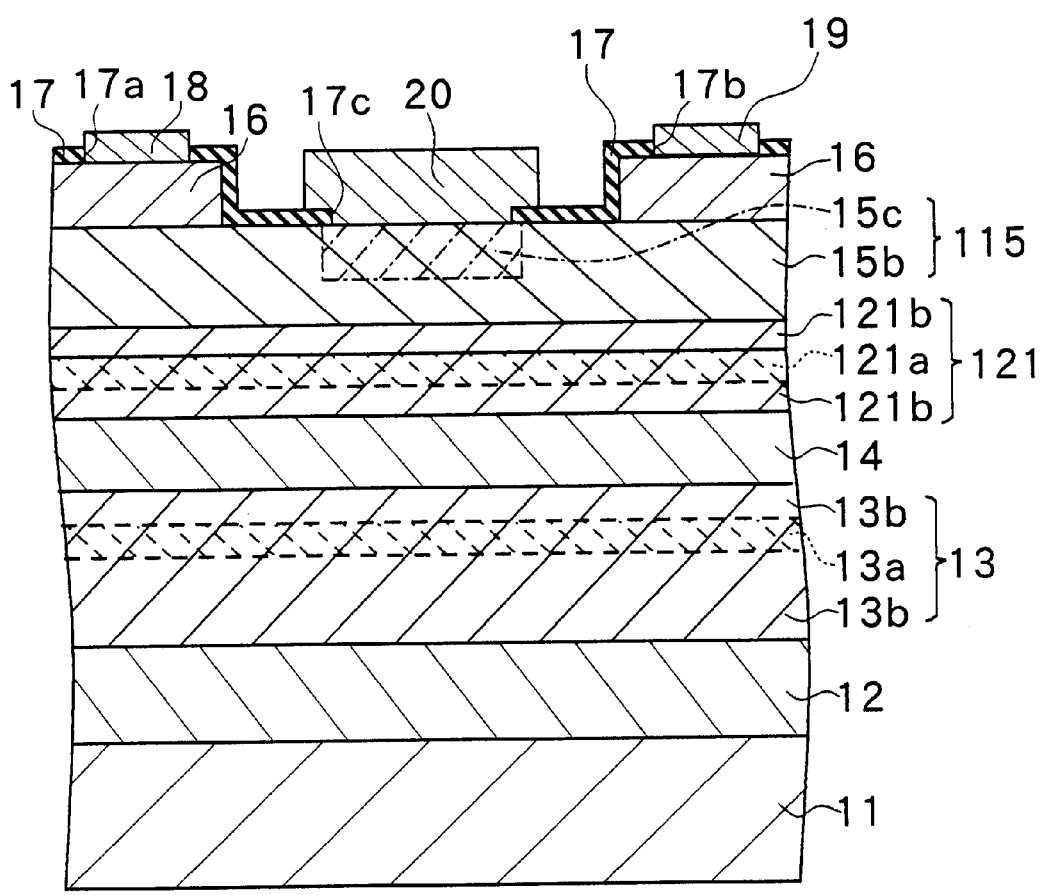
FIG. 12 is a cross section of a semiconductor device of a second embodiment of the invention.

FIG. 12 shows a configuration of a semiconductor device of a second embodiment of the invention. The semiconductor device has a configuration and effects similar to those of the device of the first embodiment except that a first barrier layer 115 replaces the first barrier layer 15 of the first embodiment and a third barrier layer 121 is further provided between the channel layer 14 and the first barrier layer 15. Like numerals are assigned to components similar to those of the first embodiment and descriptions thereof are omitted.

The first barrier layer 115 has a structure similar to that of the first barrier layer 15 of the first embodiment except that the carrier supply region 15a is eliminated. It is preferable that the first barrier layer 115 of the second embodiment is made of GaAs. This is because the diffusion speed of zinc as p-type impurity in GaAs is lower than that in AlGaAs. The p-type low resistivity region 15c is therefore easily formed.

The third barrier layer 121 is made of a semiconductor whose electron affinity is smaller than that of the semiconductor forming the barrier layer 115 (that is, a semiconductor whose electron affinity is smaller than that of the semiconductor forming the channel layer 14). For example, AlGaAs is preferable as a semiconductor whose electron affinity is smaller. In the embodiment, the third barrier layer 121 is made of $Al_{0.2}Ga_{0.8}As$ wherein aluminum mole fraction is 0.2. The third barrier layer 121 includes a carrier supply region 121a containing a high concentration of n-type impurity and a high resistivity region 121b containing a low concentration of impurity. In the embodiment, the configuration of the third barrier layer 121 is such that the high resistivity region 121b having a thickness of 2 nm and undoped with impurity, the carrier supply region 121a having a thickness of 6 nm and doped with silicon as n-type impurity of the order of $2.4 \times 10^{12} cm^{-2}$, and the high resistivity region 121b having a thickness of 12 nm and undoped with impurity, each stacked on the channel 14 in this order. The third barrier layer 121 may not include the high resistivity regions 121b but includes the carrier supply region 121a only.

Figure 13:
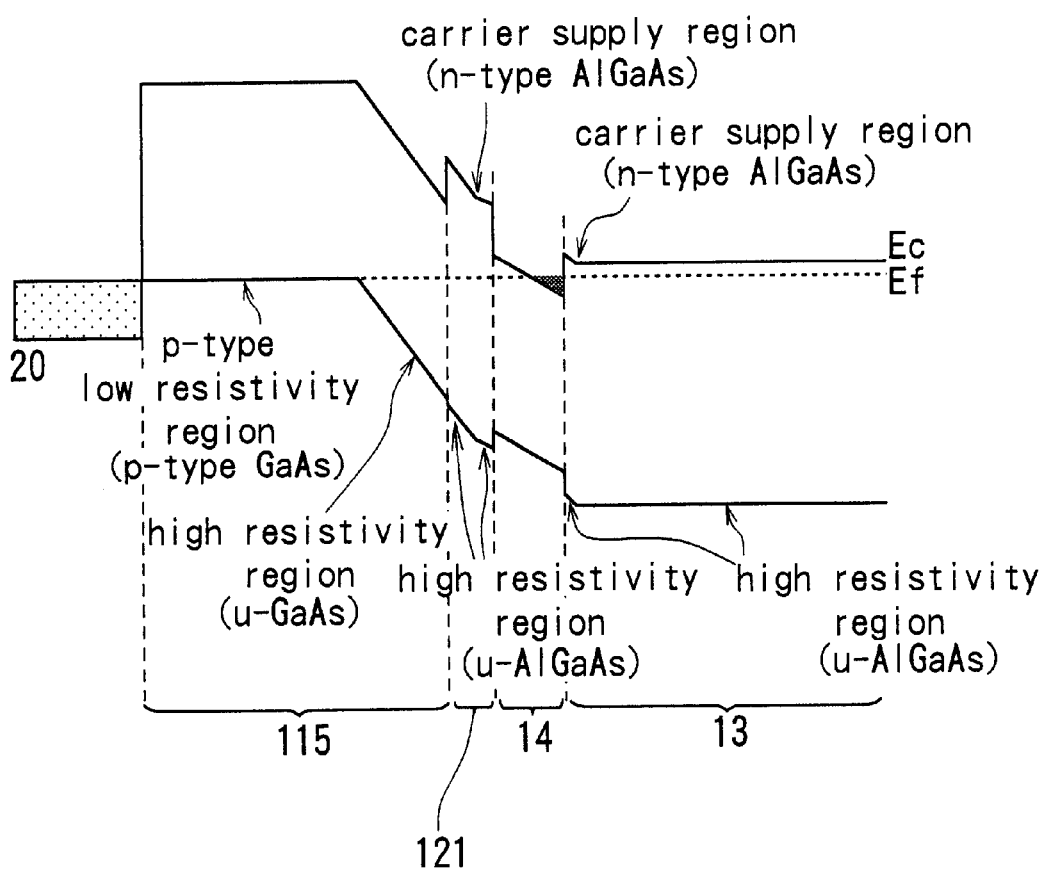
FIG. 13 illustrates an energy band structure of the semiconductor device shown in FIG. 12 wherein no voltage is applied to the gate electrode.

FIG. 13 illustrates the energy band structure of the semiconductor device under the gate electrode 20 wherein gate voltage Vg is not applied. FIG. 13 shows the embodiment wherein the second barrier layer 13 and the third barrier layer 121 are each made of $Al_{0.2}Ga_{0.8}As$, the first barrier layer 115 is made of GaAs, and the channel layer 14 is made of $In_{0.2}Ga_{0.8}As$.

As in the first embodiment, the semiconductor device includes the p-type low resistivity region 15c in the first barrier layer 115. As a result, a higher built-in voltage is obtained compared to a device with a Schottky gate. In addition, the third barrier layer 121 is provided between the channel layer 14 and the first barrier layer 115. With an application of gate voltage Vg of 1.2 V or above, for example, the barrier seen by channel electrons to the gate is high enough to suppress gate leakage current.

Furthermore, conduction-band discontinuity Δ Ec is large enough (0.31 eV in the embodiment) between the channel layer 14 and the third barrier layer 121. The energy difference between the potential minimum of the third barrier layer 121 and the electron quasi-Fermi level in the channel layer 14 is large enough as well (0.20 eV or above in the embodiment). The number of electrons in the third barrier layer 121 is therefore negligible compared to the number of electrons in the channel layer 14.

The semiconductor device with a configuration described so far operates in a manner similar to that of the device of the first embodiment and may be manufactured in a manner similar to that of the first embodiment.

The first barrier layer 115 of the semiconductor device of the second embodiment thus described is made of GaAs, for example. Consequently, the diffusion speed of zinc as p-type impurity is reduced and the p-type low resistivity region 15c is formed under control. In addition, gate contact resistance is made lower.

Since the third barrier layer 121 is provided between the channel layer 14 and the first barrier layer 115, gate leakage current is adequately suppressed although the first barrier layer 115 is made of GaAs.

(Third Embodiment)

Figure 14:
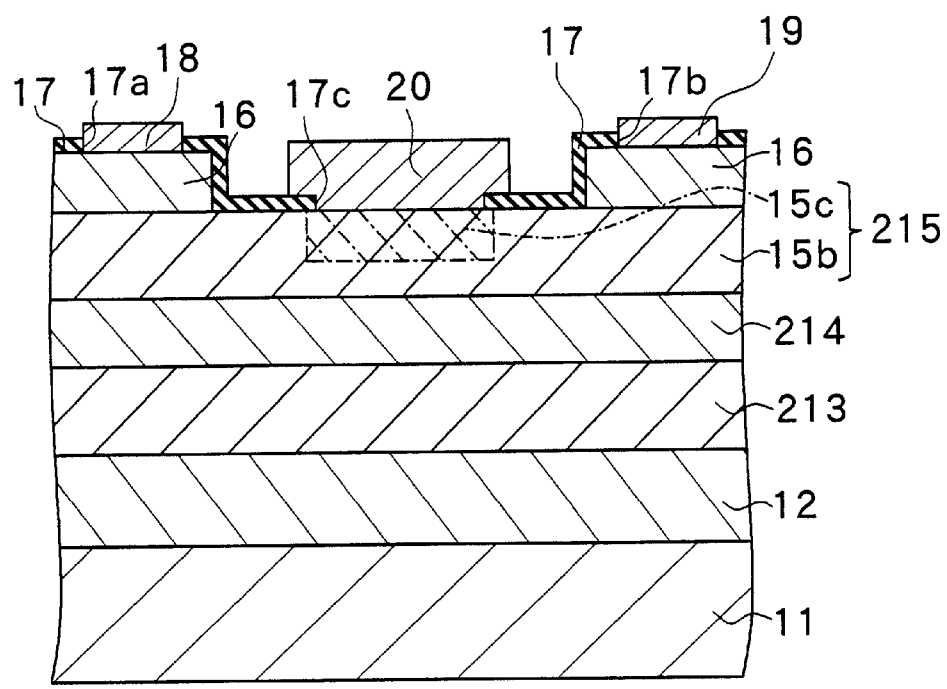
FIG. 14 is a cross section of a semiconductor device of a third embodiment of the invention.

FIG. 14 shows a configuration of a semiconductor device of a third embodiment of the invention. The semiconductor device has a configuration and effects similar to those of the device of the first embodiment except that a second barrier layer 213, a channel layer 214 and a first barrier layer 215 replace the second barrier layer 13, the channel layer 14 and the first barrier layer 15 of the first embodiment, respectively. Like numerals are assigned to components similar to those of the first embodiment and descriptions thereof are omitted.

The second barrier layer 213 has a structure similar to that of the second barrier layer 13 of the first embodiment except that the carrier supply region 13a is eliminated. The channel layer 214 has a structure similar to that of the channel layer 14 of the first embodiment except that the channel layer 214 is doped with impurity. It is preferable that the channel layer 214 is made of InGaAs with silicon as n-type impurity, for example. The impurity concentration is appropriately determined depending on maximum drain current Idmax. For example, impurity of the order of $2.0\times10^{18} cm^{-3}$ is added to the channel layer 214. The first barrier layer 215 has a structure similar to that of the first barrier layer 15 of the first embodiment except that the carrier supply region 15a is eliminated.

Figure 15:
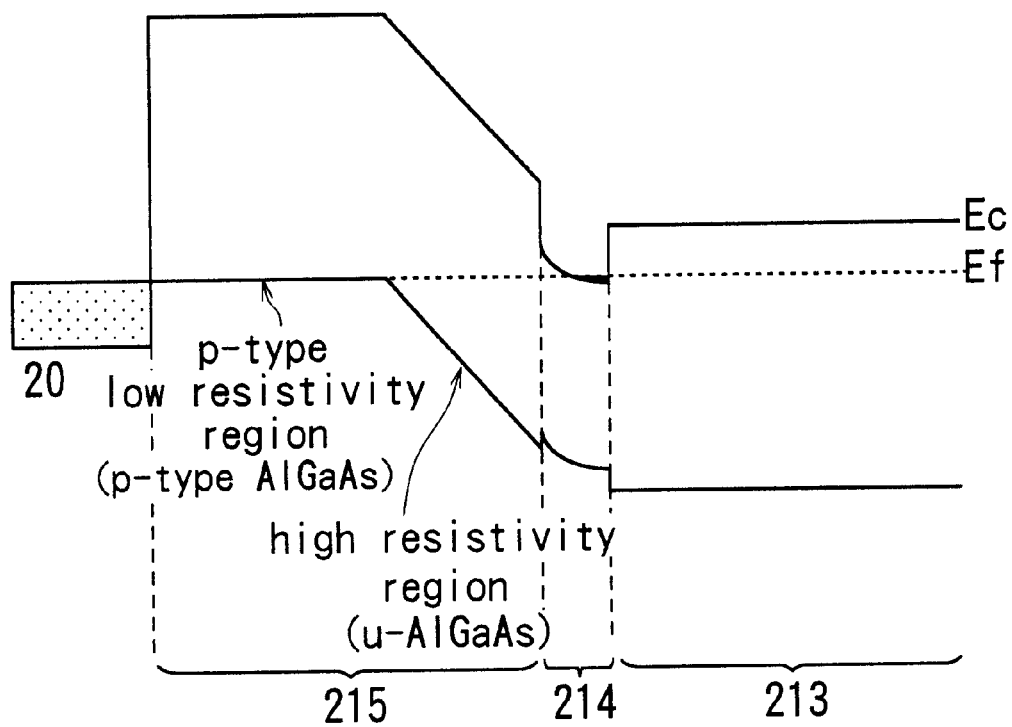
FIG. 15 illustrates an energy band structure of the semiconductor device shown in FIG. 14 wherein no voltage is applied to the gate electrode.

FIG. 15 illustrates the energy band structure of the semiconductor device under the gate electrode 20 wherein gate voltage Vg is not applied. FIG. 15 shows the embodiment wherein the second barrier layer 213 and the first barrier layer 215 are each made of $Al_{0.2}Ga_{0.8}As$, and the channel layer 214 is made of $In_{0.2}Ga_{0.8}As$.

As in the first embodiment, a higher built-in voltage is obtained compared to a device with a Schottky gate. In addition, with an application of gate voltage Vg of 1.2 V or above, for example, the barrier seen by channel electrons to the gate is high enough to suppress gate leakage current.

The semiconductor device with the configuration described so far operates in a manner similar to that of the device of the first embodiment and may be manufactured in a manner similar to that of the first embodiment.

In the semiconductor device of the third embodiment described so far, the second barrier layer 213 and the first barrier layer 215 do not include carrier supply regions while the channel layer 214 is doped with impurity. As a result, effects similar to those of the first embodiment are achieved with a simple configuration. The impurity concentration of the second barrier layer 213 and the first barrier layer 215 is kept low even if the impurity concentration of the channel layer 214 is increased for raising maximum drain current Idmax. As a result, electrons are prevented from being accumulated in the second barrier layer 213 and the first barrier layer 215. Degradation of mutual condactance Gm is therefore prevented.

(Fourth Embodiment)

Figure 16:
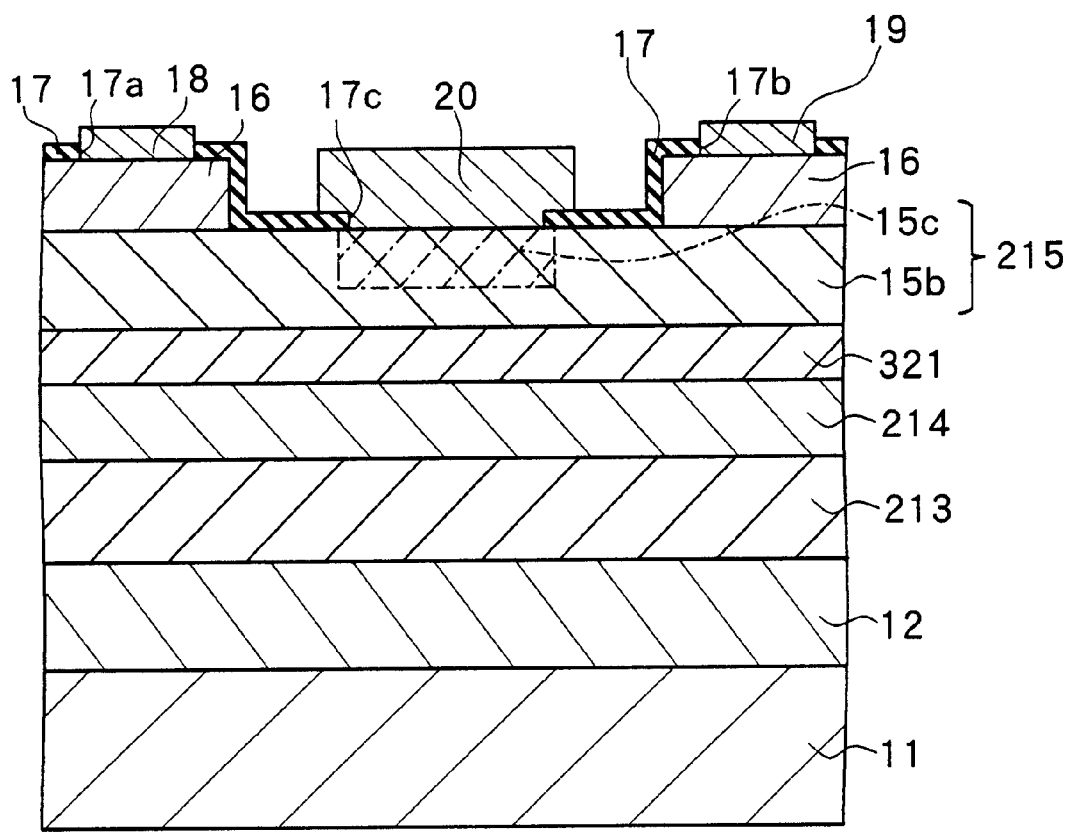
FIG. 16 is a cross section of a semiconductor device of a fourth embodiment of the invention.

FIG. 16 shows a configuration of a semiconductor device of a fourth embodiment of the invention. The semiconductor device has a configuration and effects similar to those of the device of the third embodiment except that a third barrier layer 321 is further provided between the channel layer 214 and the first barrier layer 215. Like numerals are assigned to components similar to those of the third embodiment and descriptions thereof are omitted.

It is preferable that the first barrier layer 215 of the fourth embodiment is made of GaAs. This is because the diffusion speed of zinc as p-type impurity in GaAs is lower than that in AlGaAs. The p-type low resistivity region 15c is therefore easily formed. In addition, gate contact resistance is made lower.

The third barrier layer 321 is made of a semiconductor whose electron affinity is smaller than that of semiconductor forming the barrier layer 215 (that is, a semiconductor whose electron affinity is smaller than that of the semiconductor forming the channel layer 214). For example, AlGaAs is preferable as a semiconductor whose electron affinity is smaller. In the embodiment, the third barrier layer 321 is made of $Al_{0.2}Ga_{0.8}As$ wherein the aluminum mole fraction is 0.2, undoped with impurity and including only a low concentration of impurity.

Figure 17:
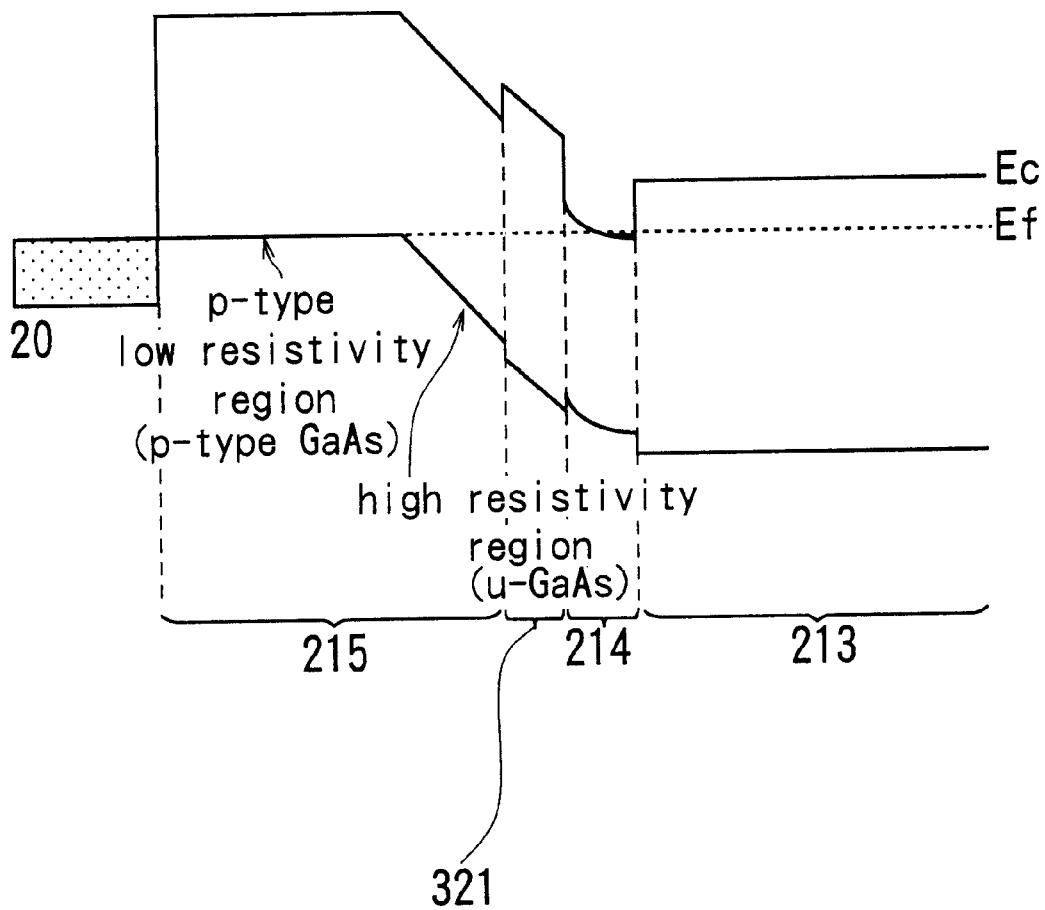
FIG. 17 illustrates an energy band structure of the semiconductor device shown in FIG. 16 wherein no voltage is applied to the gate electrode.

FIG. 17 illustrates the energy band structure of the semiconductor device under the gate electrode 20 wherein gate voltage Vg is not applied. FIG. 17 shows the embodiment wherein the second barrier layer 213 and the third barrier layer 321 are each made of $Al_{0.2}Ga_{0.8}As$ and the channel layer 214 is made of $In_{0.2}Ga_{0.8}As$.

As in the third embodiment, a higher built-in voltage is obtained compared to a device with a Schottky gate. In addition, the third barrier layer 321 is provided between the channel layer 214 and the first barrier layer 215. With an application of gate voltage Vg of 1.2 V or above, for example, the barrier seen by channel electrons to the gate electrode 20 is high enough to suppress gate leakage current.

The semiconductor device with a configuration described so far operates in a manner similar to that of the device of the first embodiment and may be manufactured in a manner similar to that of the first embodiment.

The first barrier layer 215 of the semiconductor device of the fourth embodiment thus described is made of GaAs, for example. Consequently, the diffusion speed of zinc as p-type impurity is reduced and the p-type low resistivity region 15c is formed under adequate control.

Since the third barrier layer 321 is provided between the channel layer 214 and the first barrier layer 215, gate leakage current is adequately suppressed although the first barrier layer 215 is made of GaAs.

The present invention is not limited to the embodiments described so far but may be practiced in still other ways. For example, although the depletion-type devices are described in the foregoing embodiments, the invention may be applied to enhancement-type devices.

Although the second barrier layers 13 and 213 are provided on the side opposite to the first barrier layers 15, 115 and 215 placed above the channel layer 14 and 214 in the foregoing embodiments, the invention may be applied to devices without the second barrier layers 13 and 213.

Although the carrier supply regions 13a, 15a and 121a are provided in both the second barrier layer 13 and the first barrier layer 15 or in both the second barrier layer 13 and the third barrier layer 121 in the first and second embodiments, the carrier supply regions may be provided in either the second barrier layer 13 or the first barrier layer 15, or in either the second barrier layer 13 or the third barrier layer 121.

In the third and fourth embodiments, the first barrier layer 215 is preferably made of GaAs. Alternatively, the first barrier layer 215 may be made of AlGaAs wherein the aluminum mole fraction is low.

As described so far, the semiconductor device of the invention comprises the first barrier layer between the channel layer and the gate electrode. The first barrier layer is made of a semiconductor whose electron affinity is smaller than that of a semiconductor forming the channel layer and includes the p-type low resistivity region. As a result, the linearity of the mutual conductance and the gate-source capacitance with regard to the gate voltage is improved and the built-in voltage is raised. In addition, parasitic resistance component is reduced. The source resistance is thereby reduced. Power-added efficiency is thus enhanced and the operation of the device with a single positive voltage supply is easily achieved.

Obviously many modifications and variations of the present invention are possible in the light of the above teachings. It is therefore to be understood that within the scope of the appended claims the invention may be practiced otherwise than as specifically described.

What is claimed is:

1. A semiconductor device including a source electrode and a drain electrode between which a gate electrode is provided, comprising:
   a channel layer made of a semiconductor as a current path between the source electrode and the drain electrode and below the source electrode and the drain electrode; and
   a first barrier layer formed between the channel layer and the gate electrode and made of a semiconductor whose electron affinity is smaller than that of the semiconductor forming the channel layer, said barrier layer including a p-type low resistive region with a high concentration of p-type impurity provided in contact with the gate electrode and spaced apart from the channel layer, and a high resistivity region with a low concentration of impurity present, said low resistivity region being lower in resistance than said high resistivity region, said low resistivity region being higher in impurity concentration than said high resistivity region.

2. A semiconductor device according to claim 1 wherein the p-type low resistivity region in the first barrier layer is located within the high resistivity region, except a portion in contact with the gate electrode.

3. A semiconductor device according to claim 1 wherein a p-type impurity concentration in the p-type low resistivity region in the first barrier layer is $1\times10^{18}$ cm$^{-3}$ or above.

4. A semiconductor device according to claim 1 wherein an impurity concentration in the high resistivity region in the first barrier layer is $2\times10^{17}$ cm$^{-3}$ or below and resistivity of the high resistivity region is $1\times10^{-2}$ ohm-cm or above.

5. A semiconductor device according to claim 1 wherein the first barrier layer further includes a carrier supply region with n-type impurity.

6. A semiconductor device according to claim 1 wherein the first barrier layer is made of AlGaAs that is a group III-V compound semiconductor and the channel layer is made of InGaAs that is a group III-V compound semiconductor.

7. A semiconductor device according to claim 6 wherein aluminum mole fraction is 0.25 or below in the AlGaAs forming the first barrier layer.

8. A semiconductor device according to claim 6 wherein indium mole fraction is 0.1 or above in the InGaAs forming the channel layer.

9. A semiconductor device according to claim 6 wherein the p-type low resistivity region in the first barrier layer is formed through diffusion of zinc as p-type impurity.

10. A semiconductor device according to claim 1 further comprising a second barrier layer placed on a side of the channel layer opposite to the first barrier layer and made of a semiconductor whose electron affinity is smaller than that of the semiconductor forming the channel layer.

11. A semiconductor device according to claim 10 wherein the second barrier layer includes a carrier supply region with n-type impurity at least in part of the second barrier layer.

12. A semiconductor device according to claim 10 wherein the first and second barrier layers are each made of AlGaAs that is a group III-V compound semiconductor and the channel layer is made of InGaAs that is a group III-V compound semiconductor.

13. A semiconductor device according to claim 1 further comprising a third barrier layer placed between the channel layer and the first barrier layer and made of a semiconductor whose electron affinity is smaller than that of the semiconductor forming the first barrier layer.

14. A semiconductor device according to claim 13 wherein the third barrier layer includes a carrier supply region with n-type impurity at least in part of the third barrier layer.

15. A semiconductor device according to claim 13 wherein the first barrier layer is made of GaAs that is a group III-V compound semiconductor, the channel layer is made of InGaAs that is a group III-V compound semiconductor, and the third barrier layer is made of AlGaAs that is a group III-V compound semiconductor.

16. A semiconductor device according to claim 15 wherein the p-type low resistivity region in the first barrier layer is formed through diffusion of zinc as p-type impurity.

17. A semiconductor device according to claim 1 wherein the channel layer includes n-type impurity.

* * * * *